(12) United States Patent
Tian et al.

(10) Patent No.: US 8,309,945 B2
(45) Date of Patent: Nov. 13, 2012

(54) PROGRAMMABLE METALLIZATION MEMORY CELL WITH PLANARIZED SILVER ELECTRODE

(75) Inventors: Wei Tian, Bloomington, MN (US); Dexin Wang, Eden Prairie, MN (US); Venugopalan Vaithyanathan, Bloomington, MN (US); Yang Dong, Edina, MN (US); Muralikrishnan Balakrishnan, Bloomington, MN (US); Ivan Petrov Ivanov, Apple Valley, MN (US); Ming Sun, Eden Prairie, MN (US); Dimitar Velikov Dimitrov, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/396,731

(22) Filed: Feb. 15, 2012

(65) Prior Publication Data

US 2012/0138884 A1 Jun. 7, 2012

Related U.S. Application Data

(63) Continuation of application No. 12/362,532, filed on Jan. 30, 2009, now Pat. No. 8,134,138.

(51) Int. Cl.
*H01L 29/02* (2006.01)
(52) U.S. Cl. ............. 257/2; 257/E29.166; 257/E31.019; 257/E45.001
(58) Field of Classification Search ....... 257/2, E29.166, 257/E31.029, E45.001
See application file for complete search history.

(56) References Cited

U.S. PATENT DOCUMENTS

| | | | |
|---|---|---|---|
| 5,637,028 A * | 6/1997 | Haisma et al. | 451/36 |
| 5,761,115 A | 6/1998 | Kozicki | |
| 6,569,705 B2 | 5/2003 | Chiang | |
| 6,660,136 B2 | 12/2003 | Li | |
| 6,884,144 B2 | 4/2005 | Chandrasekaran | |
| 7,151,273 B2 | 12/2006 | Campbell | |
| 7,303,939 B2 * | 12/2007 | Klein | 438/95 |
| 7,364,644 B2 | 4/2008 | Li | |
| 2006/0270099 A1 | 11/2006 | Campbell | |
| 2008/0136572 A1 * | 6/2008 | Ayazi et al. | 336/90 |
| 2008/0178444 A1 | 7/2008 | Fujii | |
| 2008/0217670 A1 * | 9/2008 | Dahmani | 257/296 |
| 2009/0072348 A1 * | 3/2009 | Klostermann et al. | 257/530 |
| 2009/0268505 A1 * | 10/2009 | Beer | 365/148 |

OTHER PUBLICATIONS

M. Ackerman, et al., Mass Spectrometric Determination of the Dissociation Energies of the Molecules AgAu, AgCu, and AuCu, The Journal of Chemical Physics, vol. 33, No. 6, Dec. 1960.

* cited by examiner

*Primary Examiner* — Lex Malsawma
(74) *Attorney, Agent, or Firm* — Mueting Raasch & Gebhardt PA

(57) ABSTRACT

Programmable metallization memory cells having a planarized silver electrode and methods of forming the same are disclosed. The programmable metallization memory cells include a first metal contact and a second metal contact, an ion conductor solid electrolyte material is between the first metal contact and the second metal contact, and either a silver alloy doping electrode separates the ion conductor solid electrolyte material from the first metal contact or the second metal contact, or a silver doping electrode separates the ion conductor solid electrolyte material from the first metal contact. The silver electrode includes a silver layer and a metal seed layer separating the silver layer from the first metal contact.

20 Claims, 4 Drawing Sheets

PROGRAMMABLE METALLIZATION MEMORY CELL WITH PLANARIZED SILVER ELECTRODE

CROSS-REFERENCE TO RELATED APPLICATION

This application is a continuation application of 12/362,532, filed Jan. 30, 2009, the contents of which is hereby incorporated by reference in its entirety.

BACKGROUND

Memory devices are common in electronic systems and computers to store data. These memory devices may be volatile memory, where the stored data is lost if the power source is disconnected or removed, or non-volatile, where the stored data is retained even during power interruption. An example of a non-volatile memory device is the programmable metallization cell (PMC) that is also known as a conductive bridging RAM (CBRAM), nanobridge memory, or electrolyte memory.

A PMC utilizes an ion conductor such as a chalcogenide type or an oxide type and at least two electrodes (e.g., an anode and a cathode) with the ion conductor between the electrodes. When a voltage is applied across the electrodes, superionic clusters or conducting filaments rapidly grow from the cathode through the ion conductor towards the anode. This gives rise to a low resistance state. When an electric field of opposite polarity is applied across the electrodes, the conducting filaments dissolve and the conducing paths are disrupted. This gives rise to the high resistance state. The two resistance states that are switchable by the application of the appropriate electric field are used to store the memory data bit of "1" or "0".

An exemplary PMC utilizes germanium selenide with silver ions diffused therein. Current methods provide silver ions within the germanium selenide material by initially depositing the germanium selenide glass layer onto a substrate, typically a first electrode, and then depositing a thin overlying layer of silver, typically by physical vapor deposition (i.e., sputtering). The thin silver layer can then exposed to electromagnetic energy such as ultraviolet (UV) radiation to diffuse silver into the germanium selenide layer, such that a homogenous distribution of silver throughout the layer is ultimately achieved. The upper electrode can then be formed from silver that is sputter deposited onto the metal-doped germanium selenide layer.

However, the formation of the silver electrode is wrought with drawbacks. For example, issues of adhesion, agglomeration and non-uniform thickness plague the formation of the silver electrode for the PMC. Therefore, a need exists for a PMC construction and processes for fabricating PMC that avoids such problems.

BRIEF SUMMARY

The present disclosure relates to programmable metallization memory cells having a planarized silver electrode and methods of forming the same are disclosed.

In one illustrative embodiment the programmable metallization memory cell include a first metal contact and a second metal contact. An ion conductor solid electrolyte material is between the first metal contact and the second metal contact. A silver alloy doping electrode separates the ion conductor solid electrolyte material from the first metal contact or the second metal contact. The silver alloy electrode includes an atomic mixture of silver atoms and aluminum atoms, copper atoms, gold atoms, ruthenium atoms, or titanium atoms.

In another illustrative embodiment a programmable metallization memory cell includes a first metal contact and a second metal contact. An ion conductor solid electrolyte material is between the first metal contact and the second metal contact. A silver doping electrode separates the ion conductor solid electrolyte material from the first metal contact. The silver doping electrode includes a silver layer and a metal seed layer separating the silver layer from the first metal contact.

One illustrative method of forming a programmable metallization memory cell includes disposing an ion conductor solid electrolyte material between a first metal contact and a second metal contact and depositing a silver doping electrode between the ion conductor solid electrolyte material and the first metal contact or the second metal contact. The depositing step forms a silver doping electrode having a surface RMS roughness of less than 2.0 nm.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
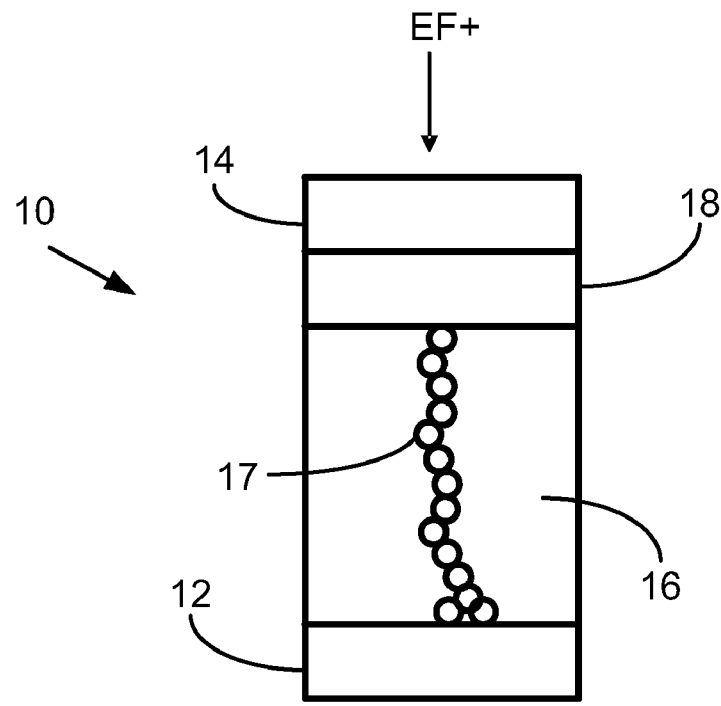
FIG. 1 is a schematic diagram of an illustrative programmable metallization memory cell in a low resistance state.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", and "on top", if used herein, are utilized for ease of description to describe spatial relationships of an element(s) to another. Such spatially related terms encompass different orientations of the device in use or operation in addition to the particular orientations depicted in the figures and described herein. For example, if a cell depicted in the figures is turned over or flipped over, portions previously described as below or beneath other elements would then be above those other elements.

As used herein, when an element, component or layer for example is described as being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

The present disclosure relates to programmable metallization memory cells having a planarized silver electrode and methods of forming the same are disclosed. A silver electrode in the programmable metallization memory cell can be formed of a silver alloy or be formed of a bi-layer of a metal seed layer and a silver layer. These silver electrodes have a surface RMS roughness of less than 2.0 nm and enable the integration compatibility and improve the uniformity of the programmable metallization memory cell. While the present disclosure is not so limited, an appreciation of various aspects of the disclosure will be gained through a discussion of the examples provided below.

FIG. 1 is a schematic diagram of an illustrative programmable metallization memory cell 10 in a low resistance state. Programmable metallization cell (PMC) memory is based on the physical re-location of superionic regions within an ion conductor solid electrolyte material 16. The PMC memory cell 10 includes an electrochemically active doping electrode 18, an ion conductor solid electrolyte material 16, a first metal contact 12, and a second metal contact 14. The ion conductor solid electrolyte material 16 is between the first metal contact 12 and the second metal contact 14. The doping electrode 18 separates the ion conductor solid electrolyte material 16 from the second metal contact 14.

The doping electrode 18 described herein can be formed of a silver alloy or formed of a bi-layer of a metal seed layer and a silver layer. The silver doping electrodes described herein provide a planarized silver electrode, that is, the silver doping electrode has a surface RMS roughness of less than 2.0 nm, at a deposition thickness of 60 nm as described below. A pure silver doping electrode deposited as described herein has been shown to have a surface RMS roughness of greater than 10 nm, at a deposition thickness of 60 nm, rendering the silver doping electrode too rough for most integration compatibility without an additional planarization step such as, for example, CMP. This planarized silver doping electrode allows the silver doping electrode to be deposited on or adjacent to a semiconductor substrate utilizing semiconductor fabrication techniques and then the ion conductor solid electrolyte material can be deposited on the silver doping electrode and still provide a relatively uniform layer formation of the ion conductor solid electrolyte material without the need for an additional planarization step such as, for example, CMP.

The first metal contact 12 and the second metal contact 14 can be formed of any useful metallic material. In many embodiments, one or both of the first metal contact 12 and a second metal contact 14 are formed of electrochemically inert metals such as, for example, platinum, gold, and the like. In some embodiments the first metal contact 12 and/or a second metal contact 14 have a two or more metal layers, where the metal layer closest to the ion conductor solid electrolyte material 16 is electrochemically inert while additional layers can be electrochemically active.

The ion conductor solid electrolyte material 16 can be formed of any useful material that provides for the formation of conducting filaments 17 within the ion conductor solid electrolyte material and extend between the doping electrode 18 and the metal contact 12 upon application of an electric field EF+. In many embodiments the ion conductor solid electrolyte material 16 is a chalcogenide-type material such as, for example, $GeS_2$, $GeSe_2$, $CuS_2$, CuTe, and the like. In other embodiments the ion conductor solid electrolyte material 16 is an oxide-type material such as, for example, $WO_3$, $SiO_2$, $Gd_2O_3$ and the like.

Application of an electric field EF+across the doping electrode 18 and the metal contact 12 allow doped cations (i.e., silver ions) to migrate from the doping electrode 18 toward the metal contact 12, forming conducting filaments 17 within the ion conductor solid electrolyte material 16. The presence of the conducting filaments 17 within the ion conductor solid electrolyte material 16 reduces electrical resistance between the first metal contact 12 and the second metal contact 14 and gives rise to the low resistance state of the programmable metallization memory cell 10.

Reading the PMC 10 simply requires a small voltage applied across the cell. If the conducting filaments 17 are present in that cell, the resistance will be low, leading to higher current, which can be read as a "1". If there are no conducting filaments 17 present, the resistance is higher, leading to low current, which can be read as a "0" as illustrated in FIG. 2.

Figure 2:
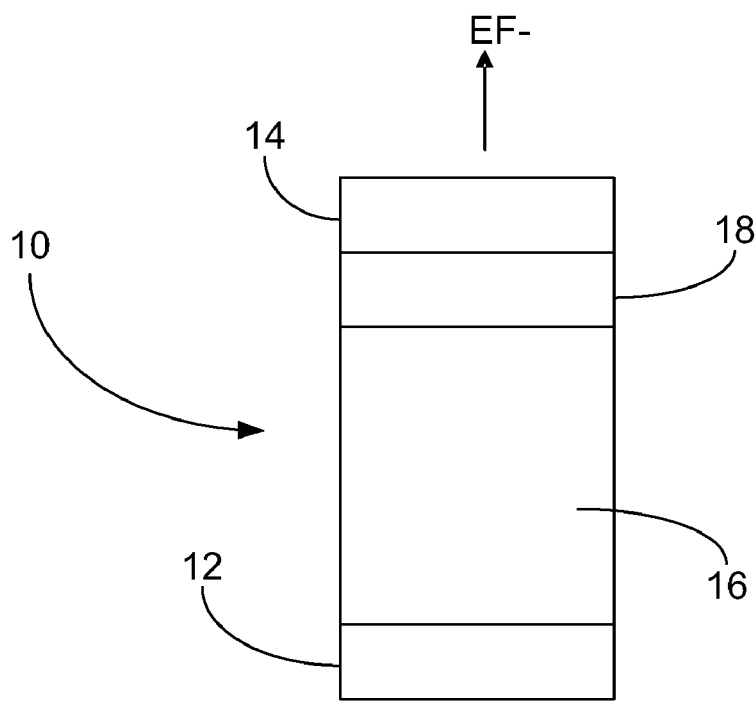
FIG. 2 is schematic diagram of an illustrative programmable metallization memory cell in a high resistance state.

FIG. 2 is schematic diagram of an illustrative programmable metallization memory cell 10 in a high resistance state. Application of an electric field of opposite polarity FE-ionizes the conducting filaments and moves the doping ions back to the doping electrode 18 and gives rise to the high resistance state of the programmable metallization memory cell 10. The low resistance state and the high resistance state are switchable with an applied electric field and are used to store the memory bit "1" and "0".

Figure 3:
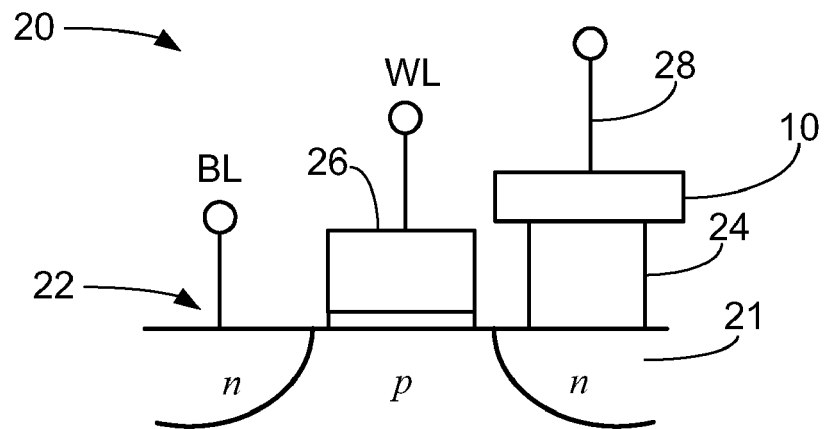
FIG. 3 is a schematic diagram of an illustrative programmable metallization memory unit including a semiconductor transistor.

FIG. 3 is a schematic diagram of an illustrative programmable metallization memory unit 20 including a semiconductor transistor 21. The programmable metallization memory unit 20 includes a programmable metallization memory cell 10, as described herein electrically coupled to a semiconductor transistor 22 via an electrically conducting element 24. The semiconductor transistor 22 includes a semiconductor substrate 21 having doped regions (e.g., illustrated as n-doped regions) and a channel region (e.g., illustrated as a p-doped channel region) between the doped regions The transistor 22 includes a gate 26 that is electrically coupled to a word line WL to allow selection and current to flow from the bit line BL to the second metal contact 28. An array of programmable metallization memory unit 20 can be formed on a semiconductor substrate utilizing semiconductor fabrication techniques.

Figure 4:
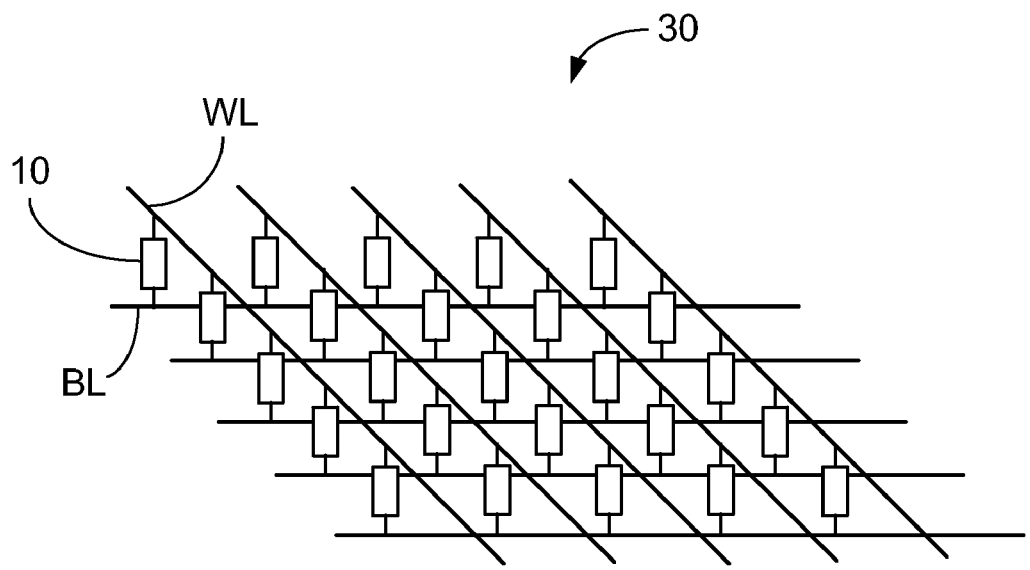
FIG. 4 is a schematic diagram of an illustrative programmable metallization memory array.

FIG. 4 is a schematic diagram of an illustrative programmable metallization memory array 30. The programmable metallization memory array 30 includes a plurality of word lines WL and a plurality of bit lines BL forming a cross-point array. At each cross-point a programmable metallization memory cell 10 is electrically coupled to a word line WL and a bit line BL. A select device (not shown) can be at each cross-point or at each word line WL and bit line BL.

Figure 5:
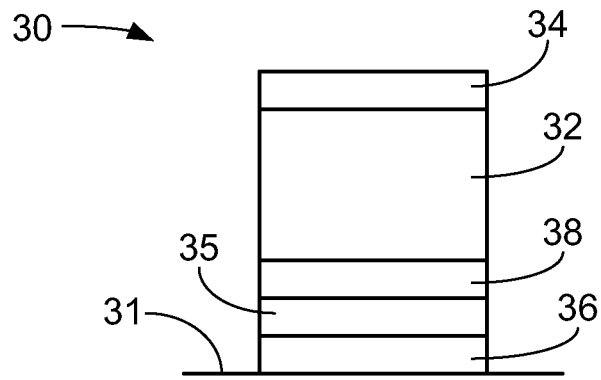
FIG. 5 is a schematic diagram of an illustrative programmable metallization memory cell having a metal seed layer and a silver layer forming a silver doping electrode.

FIG. 5 is a schematic diagram of an illustrative programmable metallization memory cell 30 having a metal seed layer 35 and a silver layer 38 forming a silver doping electrode. The programmable metallization memory cell 30 includes a first metal contact 36 and a second metal contact 34. The first metal contact 36 is deposited on or adjacent to a semiconductor substrate 31, thus the first metal contact 36 can also be referred to as the lower metal contact 36 or bottom metal contact 36. The second metal contact 34 is deposited after the first metal contact 36. The second metal contact 34 can also be referred to as the upper metal contact 34 or top metal contact 34.

An ion conductor solid electrolyte material 32 (described above) is between the first metal contact 36 and the second metal contact 34. A silver doping electrode separates the ion conductor solid electrolyte material 32 from the first metal contact 36. The silver doping electrode includes a silver layer 38 and a metal seed layer 35 separating the silver layer 38 from the first metal contact 36.

The metal seed layer 35 can be formed of any useful metal and have any useful thickness. In many embodiments the metal seed layer 35 is formed of titanium, aluminum, or ruthenium. In many embodiments the metal seed layer 35 has a thickness in a range from 0.3 to 20 nm or from 0.5 to 5 nm. The metal seed layer 35 can be deposited utilizing any useful method such as, for example, physical vapor deposition techniques.

The silver layer 38 can have any useful thickness. In many embodiments the silver layer 38 has a thickness in a range from 5 to 200 nm or from 10 to 100 nm. The silver layer 38 can be deposited utilizing any useful method such as, for example, physical vapor deposition techniques. In many embodiments the silver layer 38 has planarized or smooth surface, e.g., a surface RMS roughness of less than 2.0 nm.

Figure 6:
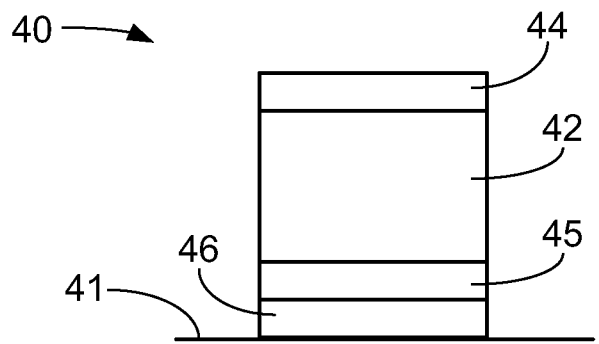
FIG. 6 is a schematic diagram of an illustrative programmable metallization memory cell having a lower silver alloy doping electrode.

FIG. 6 is a schematic diagram of an illustrative programmable metallization memory cell 40 having a lower silver alloy doping electrode 45. The programmable metallization memory cell 40 includes a first metal contact 46 and a second metal contact 44. The first metal contact 46 is deposited on or adjacent to a semiconductor substrate 41, thus the first metal contact 46 can also be referred to as the lower metal contact 46 or bottom metal contact 46. The second metal contact 44 is deposited after the first metal contact 46. The second metal contact 44 can also be referred to as the upper metal contact 44 or top metal contact 44.

An ion conductor solid electrolyte material 42 (described above) is between the first metal contact 46 and the second metal contact 44. A silver alloy doping electrode 45 separates the ion conductor solid electrolyte material 42 from the first metal contact 46. The silver alloy doping electrode 45 includes an atomic mixture of silver atoms and aluminum atoms, copper atoms, gold atoms, ruthenium atoms, or titanium atoms. In some embodiments the silver alloy doping electrode 45 includes an atomic mixture of silver atoms and aluminum atoms. In some embodiments the silver alloy doping electrode 45 includes an atomic mixture of silver atoms and copper atoms. In some embodiments the silver alloy doping electrode 45 includes an atomic mixture of silver atoms and titanium atoms. The silver alloy can be formed of any useful amount of silver and other metal as described above. In many embodiments the silver alloy includes from 50 to 85% atomic % sliver and from 50 to 15 atomic % of aluminum atoms, copper atoms, gold atoms, ruthenium atoms, or titanium atoms. The silver alloy doping electrode 45 can have any useful thickness. In many embodiments the silver alloy doping electrode 45 has a thickness in a range from 5 to 200 nm or from 10 to 100 nm. The silver alloy doping electrode 45 can be deposited utilizing any useful method such as, for example, physical vapor deposition techniques. In many embodiments the silver alloy doping electrode 45 has planarized or smooth surface, e.g., a surface RMS roughness of less than 2.0 nm.

Figure 7:
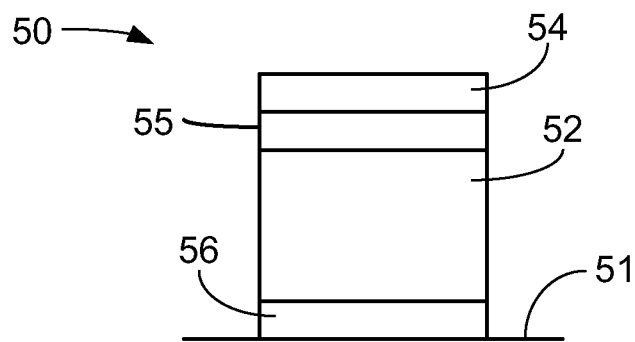
FIG. 7 is a is a schematic diagram of an illustrative programmable metallization memory cell having an upper silver alloy doping electrode.

FIG. 7 is a schematic diagram of an illustrative programmable metallization memory cell 50 having a upper silver alloy doping electrode 55. The programmable metallization memory cell 50 includes a first metal contact 56 and a second metal contact 54. The first metal contact 56 is deposited on or adjacent to a semiconductor substrate 51, thus the first metal contact 56 can also be referred to as the lower metal contact 56 or bottom metal contact 56. The second metal contact 54 is deposited after the first metal contact 56. The second metal contact 54 can also be referred to as the upper metal contact 54 or top metal contact 54.

An ion conductor solid electrolyte material 52 (described above) is between the first metal contact 56 and the second metal contact 54. A silver alloy doping electrode 55 separates the ion conductor solid electrolyte material 52 from the second metal contact 54. The silver alloy doping electrode 55 includes an atomic mixture of silver atoms and aluminum atoms, copper atoms, gold atoms, ruthenium atoms, or titanium atoms. In some embodiments the silver alloy doping electrode 55 includes an atomic mixture of silver atoms and aluminum atoms. In some embodiments the silver alloy doping electrode 55 includes an atomic mixture of silver atoms and copper atoms. In some embodiments the silver alloy doping electrode 55 includes an atomic mixture of silver atoms and titanium atoms. The silver alloy can be formed of any useful amount of silver and other metal as described above. In many embodiments the silver alloy includes from 50 to 85% atomic % sliver and from 50 to 15 atomic % of aluminum atoms, copper atoms, gold atoms, ruthenium atoms, or titanium atoms. The silver alloy doping electrode 55 can have any useful thickness. In many embodiments the silver alloy doping electrode 55 has a thickness in a range from 5 to 200 nm or from 10 to 100 nm. The silver alloy doping electrode 55 can be deposited utilizing any useful method such as, for example, physical vapor deposition techniques. In many embodiments the silver alloy doping electrode 55 has planarized or smooth surface, e.g., a surface RMS roughness of less than 2.0 nm.

Figure 8:
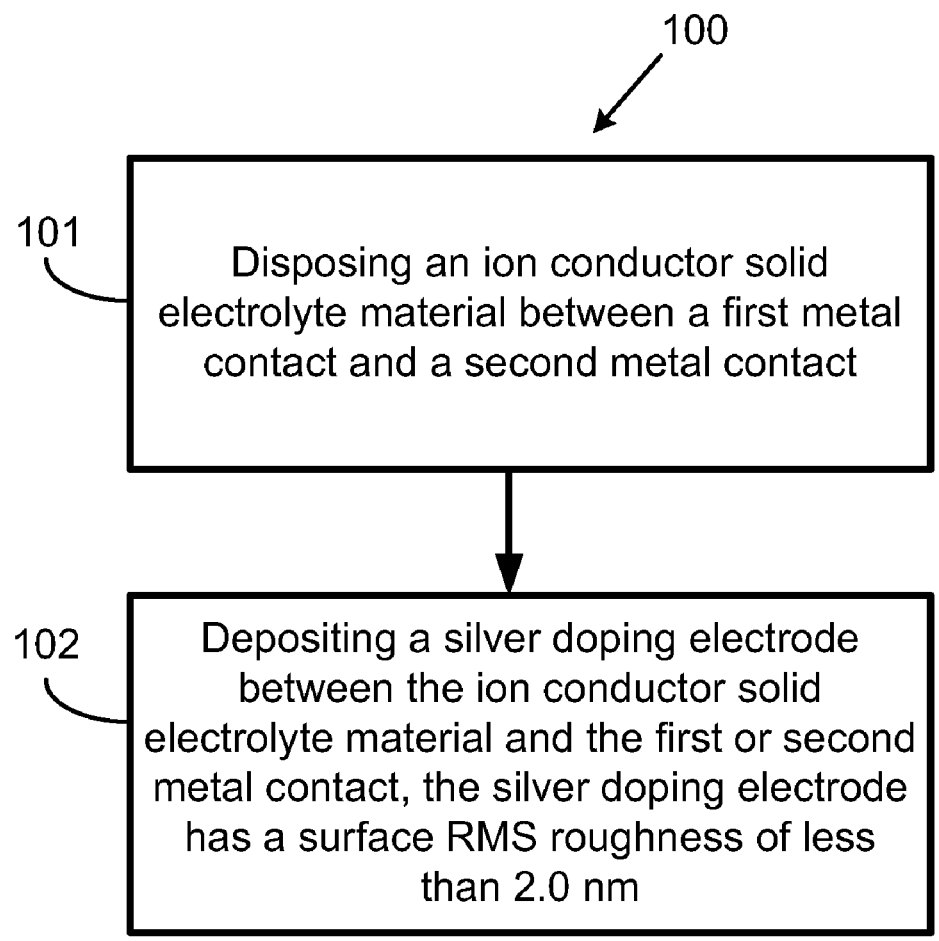
FIG. 8 is a flow diagram of an illustrative method of forming a programmable metallization memory cell.

FIG. 8 is a flow diagram of an illustrative method of forming a programmable metallization memory cell 100. The method includes disposing an ion conductor solid electrolyte material between an first metal contact and a second metal contact at block 101. The method includes depositing a silver electrode between the ion conductor solid electrolyte material and the first or second metal contact, the silver electrode having a surface RMS roughness of less than 2.0 nm at block 102. The silver doping electrode can be a silver alloy doping electrode or a bi-layer structure including a metal seed layer and a silver layer.

The silver alloy doping electrode can be formed utilizing physical vapor deposition techniques such as co-sputtering. Two sputtering targets can be utilized to form the silver alloy where one target is silver and the other target is another metal, as described above.

Thus, embodiments of the PROGRAMMABLE METALLIZATION MEMORY CELL WITH PLANARIZED SILVER ELECTRODE are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A programmable metallization memory cell comprising:
   a first metal contact disposed directly on a semiconductor substrate and a second metal contact;
   an ion conductor solid electrolyte material between the first metal contact and the second metal contact; and
   a silver alloy doping electrode separating the ion conductor solid electrolyte material from the first metal contact, the silver alloy doping electrode comprising an atomic mixture of silver atoms and aluminum atoms, copper atoms, gold atoms, ruthenium atoms, or titanium atoms and the silver alloy doping electrode being disposed closer to the semiconductor substrate than the ion conductor solid electrolyte material.

2. A programmable metallization memory cell according to claim 1 wherein the silver alloy comprises silver atoms and copper atoms.

3. A programmable metallization memory cell according to claim 1 wherein the silver alloy comprises silver atoms and aluminum atoms.

4. A programmable metallization memory cell according to claim 1 wherein the silver alloy comprises silver atoms and titanium atoms.

5. A programmable metallization memory cell according to claim 1 wherein the silver alloy comprises from 50 to 85 atomic % silver atoms and from 50 to 15 atomic % of aluminum atoms, copper atoms, gold atoms, ruthenium atoms, or titanium atoms.

6. A programmable metallization memory cell according to claim 1 wherein the silver alloy doping electrode has a surface RMS roughness of less than 2.0 nm.

7. A programmable metallization memory cell according to claim 1 wherein the silver alloy doping electrode has a thickness in a range from 10 to 100 nm.

8. A programmable metallization memory cell according to claim 1 wherein the ion conductor solid electrolyte material chalcogenide material.

9. A programmable metallization memory cell comprising:
   a first metal contact disposed directly on a semiconductor substrate and a second metal contact;
   an ion conductor solid electrolyte material between the first metal contact and the second metal contact; and
   a silver doping electrode separating the ion conductor solid electrolyte material from the first metal contact, the silver doping electrode comprising a silver layer and a metal seed layer separating the silver layer from the first metal contact.

10. A programmable metallization memory cell according to claim 9 wherein the metal seed layer comprises titanium, aluminum, or ruthenium.

11. A programmable metallization memory cell according to claim 9 wherein the metal seed layer comprises titanium.

12. A programmable metallization memory cell according to claim 9 wherein the metal seed layer has a thickness in a range from 0.5 to 5 nm.

13. A programmable metallization memory cell according to claim 9 wherein the silver doping electrode has a surface RMS roughness of less than 2.0 nm.

14. A programmable metallization memory cell according to claim 9 further comprising a semiconductor substrate, the silver electrode being disposed closer to the semiconductor substrate than the ion conductor solid electrolyte material.

15. A programmable metallization memory cell according to claim 9 wherein the silver alloy doping electrode has a thickness in a range from 10 to 100 nm.

16. A programmable metallization memory cell according to claim 9 wherein the ion conductor solid electrolyte material chalcogenide material.

17. A memory array comprising:
   a plurality of bit lines and a plurality of word lines forming a cross-point array;
   a programmable metallization memory cell is disposed at each cross-point and electrically one bit line and one word line; the programmable metallization memory cell comprises:
      a first metal contact disposed directly on a semiconductor substrate and a second metal contact;
      an ion conductor solid electrolyte material between the first metal contact and the second metal contact; and
      a silver doping electrode separating the ion conductor solid electrolyte material from the first metal contact, the silver doping electrode being disposed closer to the semiconductor substrate than the ion conductor solid electrolyte material.

18. A memory array according to claim 17 wherein the silver alloy doping electrode has a surface RMS roughness of less than 2.0 nm.

19. A memory array according to claim 17 wherein the silver alloy doping electrode has a thickness in a range from 10 to 100 nm.

20. A memory array according to claim 17 wherein the silver doping electrode comprises from 50 to 85 atomic % silver atoms and from 50 to 15 atomic % of aluminum atoms, copper atoms, gold atoms, ruthenium atoms, or titanium atoms.

* * * * *